United States Patent

[11] 3,614,556

[72] Inventor Tetsuji Nakamura
Tokyo, Japan
[21] Appl. No. 815,651
[22] Filed Apr. 14, 1969
[45] Patented Oct. 19, 1971
[73] Assignee Tokyo Shibaura Electric Co., Ltd.
Kawasaki-shi, Japan
[32] Priority Apr. 16, 1968
[33] Japan
[31] 43/24975

[54] MAGNETOSENSITIVE SEMICONDUCTOR SWITCHING DEVICE
2 Claims, 9 Drawing Figs.

[52] U.S. Cl. .................... 317/235 R,
317/235 H, 317/235 AB, 317/235 AJ, 317/235 AE
[51] Int. Cl. .................... H01l 11/10
[50] Field of Search .................... 317/235
(23), 235 (41.1), 235 (44); 307/205, 309, 324, 252.10

[56] References Cited

UNITED STATES PATENTS

| | | | |
|---|---|---|---|
| 2,943,269 | 6/1960 | Huang .................... | 317/235 |
| 3,476,993 | 11/1969 | Aldrich et al. .................... | 317/235 |

FOREIGN PATENTS

| | | | |
|---|---|---|---|
| 1,379,254 | 10/1964 | France .................... | 317/235 |
| 657,349 | 2/1963 | Canada .................... | 317/235 |

*Primary Examiner*—Jerry D. Craig
*Attorney*—Flynn & Frishauf

ABSTRACT: A semiconductor device wherein a layer to which is generally connected the gate electrode of an ordinary thyristor and an end layer adjacent thereto are shorted by a common electrode. The PN junction defined between these layers is exposed on one lengthwise end portion of the substrate, and a switching operation is performed by an electromagnetic field instead of the gate current of the thyristor.

TETSUJI NAKAMURA,
INVENTOR.

BY Flynn & Frishauf
Attys

MAGNETOSENSITIVE SEMICONDUCTOR SWITCHING DEVICE

BACKGROUND OF THE INVENTION

The present invention relates to a semiconductor device and more particularly a magnetosensitive semiconductor switching device.

There is known a Hall power-generating element as a typical example of a magnetosensitive semiconductor element. This Hall power-generating element is indeed capable of producing an output voltage proportionate to the intensity of an electromagnetic field, but has the drawback that it has an unsatisfactory switching property.

The object of the present invention is to provide a semiconductor device capable of carrying out switching by regulating a turn-on voltage in accordance with the intensity of an electromagnetic field and further performing a bilateral control of said switching.

SUMMARY OF THE INVENTION

The present invention includes a semiconductor device comprising a semiconductor substrate having at least four layers, which is prepared by forming a new layer on at least one of those layers positioned on both end faces of a three-layer semiconductor substrate of the PNP or NPN arrangement in such a manner that said one end layer and the new layer are connected to a common electrode and the end PN junction formed between said layers is exposed on one lengthwise end portion of the substrate. To cause the aforesaid device of the present invention to perform the desired switching operation, for example, the end PN junction is formed at an inclination of a prescribed angle to a plane perpendicular to the lengthwise end portion of the substrate on which said end PN junction is exposed, in such a manner as to extend to the side of the common electrode. It is also possible to form the end layer connected to the common electrode in such a manner that the dopant concentration is progressively reduced along the plane of the end PN junction, namely, inwardly from the lengthwise end portion of the substrate on which the end PN junction is exposed.

The aforementioned semiconductor device can display the same properties as the thyristor. In this case, an externally applied electromagnetic field corresponds to the gate current of the thyristor, enabling the turn-on voltage to be controlled in accordance with the magnitude of said electromagnetic field.

DETAILED DESCRIPTION OF THE PREFERRED EMBODIMENTS

Figure 1:
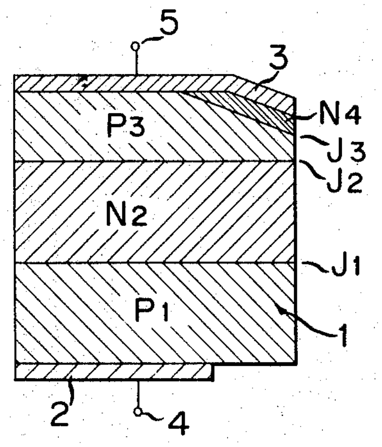
FIG. 1 is a section of a semiconductor device according to an embodiment of the present invention.
Figure 2:
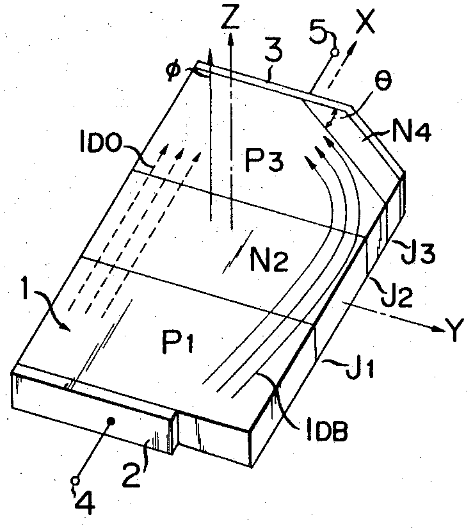
FIG. 2 is a schematic perspective view of said semiconductor device, particularly showing its operation.

There will now be described an embodiment of the present invention by reference to the appended drawings. Numeral 1 represents a silicon semiconductor device prepared in four layers, i.e., $P_1$, $N_2$, $P_3$ and $N_4$ as shown in FIGS. 1 and 2. The layer $N_4$ is formed at the partly cutaway outer end of the layer $P_3$ in an inclined relationship thereto. The semiconductor device 1 is prepared by diffusing an acceptor dopant, for example, gallium from both sides of an N-conductivity type silicon substrate to form two P-type layers $P_1$ and $P_3$ on both sides of the substrate, cutting away part of the end portion of the layer $P_3$ in an inclined form and diffusing phosphorus as a donor dopant into said cutaway end portion to form the layer $N_4$. Thus there are formed a $P_1$–$N_2$ junction $J_1$, $N_2$–$P_3$ junction $J_2$ and $P_3$–$N_4$ junction $J_3$. The junctions $J_1$ and $J_2$ are parallel to each other, while the junction $J_3$ is disposed in inclined relationship thereto, namely, one of its ends is exposed on the top side of the substrate and the other end on the lengthwise end portion of the substrate. Thus the junctions $J_2$ and $J_3$ are brought nearest to each other at the lengthwise end portion of the substrate. On the surface of the layer $P_1$ is formed a first metal electrode 2 by vapor deposition of, for example, aluminum. On the surfaces of the layers $P_3$ and $N_4$ is mounted a second metal electrode 3 in common thereto by the same method as used in preparing the first electrode. From these electrodes are led out nickel wire terminals 4 and 5.

There will now be described by reference to FIG. 2 the operation of a semiconductor device of the present invention arranged as described above.

Figure 3:
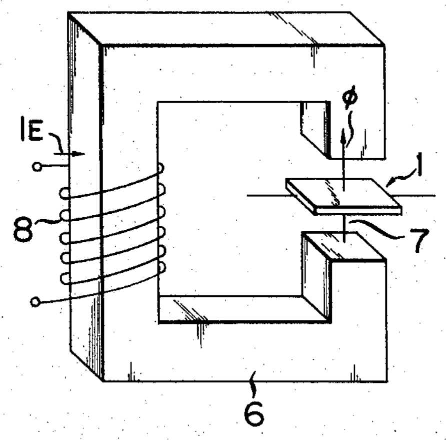
FIG. 3 is a schematic perspective view of said device, where there is applied an electromagnetic field thereon.

Now, the direction in which there extends a line connecting the electrodes 2 and 3 of the semiconductor device 1 is denoted as an X-axis, the direction in which the junctions $J_1$ and $J_2$ are arranged in parallel as a Y-axis and the direction intersecting the X and Y axes at right angles as a Z-axis. Let it be assumed that the first electrode 2 is impressed with a positive voltage and the second electrode 3 with a negative voltage. Under such condition, the junctions $J_1$ and $J_3$ are biassed in the forward direction, and the junction $J_2$ in the backward direction, so that most of the current is obstructed across the electrodes 2 and 3 except for some leakage current $I_{DO}$. If, under such condition, there is supplied an electromagnetic field $\Phi$ penetrating the semiconductor device 1 in the direction of the Z-axis indicated by an arrow, then the leakage current will be deflected to the right as indicated by solid lines $I_{DB}$. There is applied an electromagnetic field by an apparatus, for example, as shown in FIG. 3. In the space 7 defined between both ends of a C-shaped core 6 is disposed the semiconductor device 1, which is supplied with a magnetic flux $\Phi$ generated by introducing an exciting current $I_E$ through an exciting coil 8 wound around the core 6.

Figure 4:
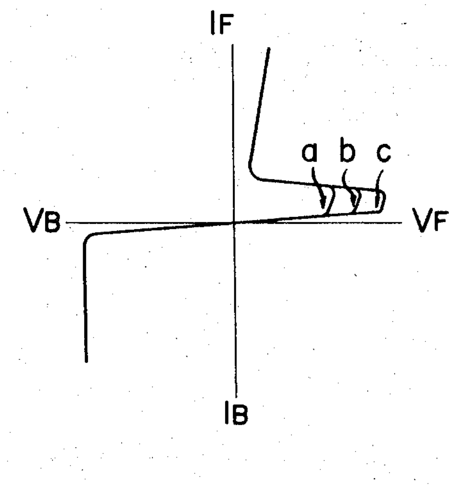
FIG. 4 is a diagram of the voltage-current properties of said device, where there are applied electromagnetic fields of different intensities.

There will now be given a detailed description by reference to FIG. 2. The leakage current $I_{DB}$ deflected by the magnetic flux $\Phi$ is concentrated to the right side of the substrate and travels through the portion of the layer $P_3$ adjacent to the inclined layer $N_4$. At this time, there occurs a voltage drop due to the resistance of the layer $P_3$, presenting a potential gradient where a positive potential progressively decreases in the layer $P_3$ along the junction $J_3$, namely, from the right side to the left side as illustrated. This potential gradient causes a potential difference to take place in the right end portion of the junction $J_3$ between the layers $P_3$ and $N_4$ in the forward direction. When the potential difference reaches a certain point, namely, when the potential gradient attains a certain value, then there flows across the layers $P_3$ and $N_4$ an equivalent current to the gate current of an ordinary thyristor, namely, there appears a turn-on condition. Accordingly, the semiconductor device is conducted to perform a switching action. Thus when the semiconductor device of the present invention is supplied with a prescribed electromagnetic field, it becomes capable of carrying out a switching action. Namely, the semiconductor device will have such voltage-current properties as presented in FIG. 4 in accordance with the electromagnetic field applied. The curves *a* and *b* of FIG. 4 represent the voltage-current properties of the semiconductor device of the present invention when it is impressed with electromagnetic fluxes $\Phi_a$ and $\Phi_b$ respectively, and the curve *c* denotes the voltage-current properties of said device when no electromagnetic field is applied thereto. Here it will be understood that the intensity of the electromagnetic field is $\Phi_a > \Phi_b > 0$. As is apparent from FIG. 4, the turn-on voltage can be controlled according to the intensity of the electromagnetic field impressed. Therefore, the present invention has made it possible to give substantially the same effect as the known thyristor by using an electromagnetic field. Referring to FIG. 2, if the semiconductor device is impressed with a voltage of opposite polarity, it will display substantially the same properties as those of a thyristor when it is similarly supplied with a voltage of opposite polarity.

Figure 5:
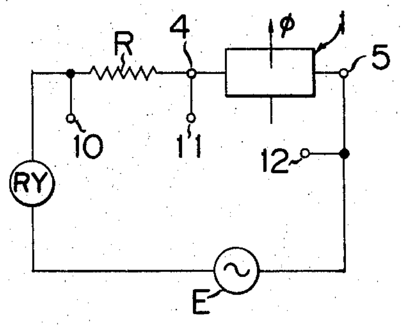
FIG. 5 shows a circuit using said device.
Figure 6:
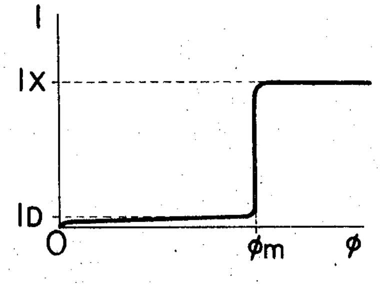
FIG. 6 is a diagram indicating the voltage-current properties of the circuit of FIG. 5.

For the purpose of the present invention, a circuit arrangement, for example, as shown in FIG. 5 will be effective, which is formed by connecting one terminal 4 of the semiconductor device 1 of the present invention to one end of an AC source E through a relay coil RY and resistor R and the other terminal 5 of said device 1 to the other end of said AC source E. Between the intensity of the electromagnetic field and the resultant current flowing through the circuit there exists such relationship that as shown in FIG. 6, when there is applied a weak magnetic flux $\Phi$, the semiconductor device of the present invention remains turned off, only allowing the flow of a leakage current $I_D$, but when the magnetic flux attains a density exceeding $\Phi_m$ the semiconductor device will be turned on, permitting the flow of a certain current IX regulated by the resistor R of FIG. 5. Since the semiconductor device of the present invention has a rectifying action when an electromagnetic field is only applied in a prescribed direction, a current from the AC source E is rectified by half waves. Further, if there is supplied an alternating electromagnetic field whose direction is reverted synchronizingly with the alternating current from the AC source E, then the leakage current is always biassed only in one direction. Accordingly, the semiconductor device of the present invention acts as one capable of a bilateral control. Utilization of these properties enables various controls to be carried out using the relay coil RY of FIG. 5 in detecting whether or not the density of the magnetic fluxes introduced exceeded a value of $\Phi_m$. If there are leadout terminals 10, 11 and 12 from the contact of the relay coil RY with the resistor R and both ends of the semiconductor device of the present invention respectively, then it is also possible to find any increase over $\Phi_m$ in the density of the magnetic fluxes applied in the form of voltage changes between the terminals 10 and 11 or those between the terminals 11 and 12. Further, it is possible to control from these voltage changes the supply of an exciting current to the exciting coil 6 of FIG. 3 using an automatic-current device.

In the semiconductor device of the present invention, as shown in FIGS. 1 and 2, the lower electrode 2 is positioned remote from the layer $N_4$, which in turn is disposed in inclined relationship to the layer $P_3$. However, if the distribution of a dopant in the layer $P_3$ has such a gradient of concentration where the proportions of the dopant progressively decrease from the right side of the semiconductor substrate to the center thereof as illustrated, then it will not be always necessary for the semiconductor element to assume the aforementioned special form. It is also possible to combine the concept or process of diffusing a dopant in the layer $P_3$ with a specified gradient of concentration and that of preparing the layer $N_4$ in an inclined form.

Figure 7:
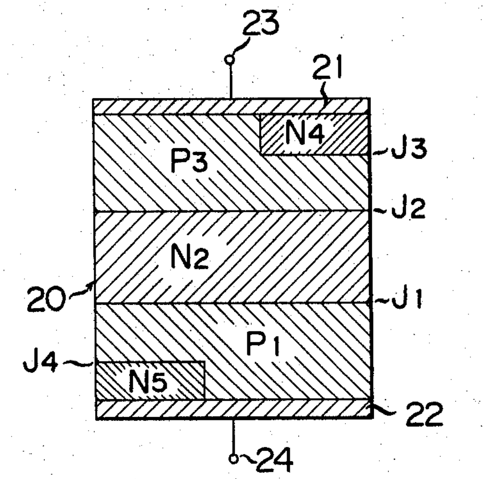
FIG. 7 is a section of a semiconductor device according to another embodiment of the invention.
Figure 8:
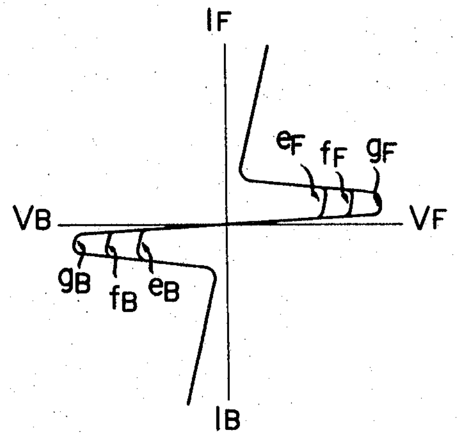
FIG. 8 is a diagram of the voltage-current properties of the device of FIG. 7.
Figure 9:
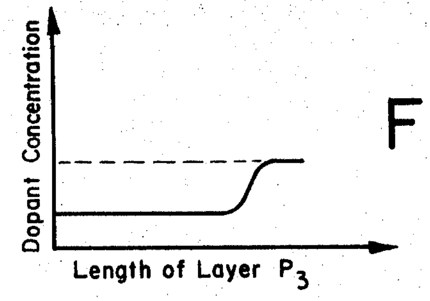
FIG. 9 is a diagram illustrating a typical dopant concentration for a semiconductor layer.

The aforementioned embodiment of the present invention was associated with a semiconductor switching device of unilateral magnetosensitivity. However, the invention is not limited to said device, but is capable of providing a semiconductor switching device of bilateral magnetosensitivity as illustrated in FIG. 7. The semiconductor device of FIG. 7 consists of a five-layer semiconductor substrate comprising the layers $N_5$, $P_1$, $N_2$, $P_3$ and $N_4$. The layer $P_3$ is formed in such a manner that the dopant concentration progressively grows smaller from the lengthwise end portion of the substrate where there is formed the layer $N_4$ to the center thereof. See, for example, FIG. 9. Said dopant is also diffused in the layer $P_1$ in the same distribution of concentration. On the exposed surfaces of the layers $P_3$ and $N_4$ is mounted a first common electrode 21 and on the exposed surfaces of the layers $N_5$ and $P_1$ is formed a second common electrode 22. From these electrodes 21 and 22 are led out lead wires 23 and 24 respectively. When a magnetic flux is impressed on this semiconductor device, it is possible to control currents flowing in both directions. Namely, said device has such properties that, as shown in FIG. 8, no matter whether the voltage impressed is positive or negative, the turn-on voltage can be controlled all the same with a desired direction magnetic flux. The curves $e_F$ and $f_F$ represent the voltage-current properties of the semiconductor device of the present invention when it is impressed with electromagnetic fields $\Phi_e$ and $\Phi_f$ respectively and the curve $g_F$ the voltage-current properties of said device when there is not applied any electromagnetic field thereto. Further, the curves $e_B$, $f_B$ and $g_B$ denote said voltage-current properties when there is supplied a voltage of opposite polarity under the same condition of the electromagnetic field.

As mentioned above, the semiconductor device of the present invention permits large currents to be easily switched by an electromagnetic field and turn-on voltage is defined according to the intensity of the electromagnetic field introduced. Also, if the voltage impressed on the semiconductor device of the present invention is rendered variable in magnitude, then the intensity of an electromagnetic field used in the switching operation of said device can be changed as desired.

It will be apparent that it is possible to fabricate, though not shown, a four-layer semiconductor element of the $N_1$–$P_2$–$N_3$–$P_4$ type as one corresponding to FIG. 1 and a five-layer semiconductor element of the $P_5$–$N_1$–$P_2$–$N_3$–$P_4$ type as one corresponding to FIG. 7.

What is claimed is:

1. A magnetosensitive semiconductor switching device comprising:

a body of semiconductor material including a first layer of one conductivity type intermediate second and third layers of the opposite conductivity type and forming a pair of opposed PN junctions, a fourth layer of said one conductivity type occupying one entire corner portion of said third layer and forming a third PN junction therewith, said third PN junction extending to the external surface of said body in inclined relationship thereto, the dopant concentration in said third layer progressively decreasing along said third PN junction inwardly from the lengthwise end portion of said body, a first electrode in ohmic contact with an external surface of said second layer, and a second electrode in ohmic contact with an external surface of said fourth layer and an exposed surface of said third layer;

potential means for biasing one of said electrodes with respect to the other; and magnetic field means for deflecting current flow in said body across said pair of electrodes so as to increase current flow in said third layer along said inclined third junction.

2. The magnetosensitive semiconductor switching device according to claim 1 wherein said first electrode is positioned on the external surface of said second layer and is spaced from the lengthwise end portion of said body to which said third PN junction extends, so as to be remote from said fourth layer.